(12) United States Patent
Memmen et al.

(10) Patent No.: US 7,509,734 B2
(45) Date of Patent: Mar. 31, 2009

(54) REPAIRING TURBINE ELEMENT

(75) Inventors: Robert L. Memmen, Cheshire, CT (US); Igor V. Belousov, Kiev (UA); Anatoly I. Kuzmichev, Kiev (UA)

(73) Assignee: United Technologies Corporation, Hartford, CT (US)

( * ) Notice: Subject to any disclaimer, the term of this patent is extended or adjusted under 35 U.S.C. 154(b) by 756 days.

(21) Appl. No.: 10/734,696

(22) Filed: Dec. 12, 2003

(65) Prior Publication Data
US 2004/0172826 A1    Sep. 9, 2004

Related U.S. Application Data

(63) Continuation-in-part of application No. 10/635,694, filed on Aug. 5, 2003, now Pat. No. 7,216,428, and a continuation-in-part of application No. 10/377,954, filed on Mar. 3, 2003.

(51) Int. Cl.
*B23P 6/00* (2006.01)
*B23P 19/04* (2006.01)

(52) U.S. Cl. .................................. 29/889.1; 29/402.09

(58) Field of Classification Search ................ 29/889.1, 29/402.09, 402.11, 402.13, 402.16, 889, 29/402.01; 118/723; 204/192.16
See application file for complete search history.

(56) References Cited

U.S. PATENT DOCUMENTS

| | | | |
|---|---|---|---|
| 763,229 A | 6/1904 | Watson | |
| 4,822,248 A | 4/1989 | Wertz et al. | |
| 5,451,142 A | 9/1995 | Cetel et al. | |
| 5,525,429 A | 6/1996 | Mannava et al. | |
| 5,732,467 A | 3/1998 | White et al. | |
| 5,783,318 A | 7/1998 | Biondo et al. | |
| 5,846,608 A | 12/1998 | Neumann et al. | |
| 6,049,978 A | 4/2000 | Arnold | |
| 6,302,625 B1 | 10/2001 | Carey et al. | |
| 7,014,889 B2 | 3/2006 | Groves et al. | |
| 2002/0076573 A1 | 6/2002 | Neal et al. | |
| 2003/0056716 A1 | 3/2003 | Johnson | |

FOREIGN PATENT DOCUMENTS

| | | |
|---|---|---|
| EP | 0905274 A1 | 3/1999 |
| EP | 1325969 A2 | 7/2003 |
| JP | 63-004066 | 1/1988 |
| JP | 08-209339 A | 8/1996 |
| JP | 2003188115 * | 7/2003 |
| WO | WO 03/028428 A2 | 4/2003 |

OTHER PUBLICATIONS

Duane G. Williams, Vacuum Coating with a Hollow Cathode Source, J. Vac. Sci. Technol., Jan.-Feb., 1974, New York.
Patent Abstracts Of Japan, vol. 122, No. 2, Jun. 10, 1988 - JP 63004066 (Hitachi Ltd.).
J.R. Treglio et al., Deposition of TiB2 at Low Temperature with Low Residual Stress Vacuum Arc Plasma Source, Surface and Coatings Technology; Dec. 3, 1993, Elsevier Sequoia SA, Switzerland.
B.A. Movchan, EB-PVD Technology in the Gas Turbine Industry: Present and Future, JOM, Nov. 1996, pp. 40-44.

* cited by examiner

*Primary Examiner*—John C Hong
(74) *Attorney, Agent, or Firm*—Bachman & LaPointe, P.C.

(57) ABSTRACT

Ion-enhanced physical vapor deposition is utilized to deposit repair material on Ti alloy turbine parts. Pulse modulation may be used to control a bias voltage and an ionization.

18 Claims, 3 Drawing Sheets

REPAIRING TURBINE ELEMENT

CROSS-REFERENCE TO RELATED APPLICATIONS

This is a continuation-in-part of U.S. patent application Ser. No. 10/377,954, filed Mar. 3, 2003, and entitled "Fan and Compressor Blade Dovetail Restoration Process" and U.S. patent application Ser. No. 10/635,694, filed Aug. 5, 2003, now U.S. Pat. No. 7,216,428 and entitled "Turbine Element Repair".

BACKGROUND OF THE INVENTION (1) Field of the Invention

The invention relates to the restoration of turbomachine parts. More particularly, the invention relates to the restoration of worn or damaged gas turbine engine fan blades and other blades and vanes.

(2) Description of the Related Art

The components of gas turbine engines are subject to wear and damage. Even moderate wear and damage of certain components may interfere with optimal operation of the engine. Particular areas of concern involve the airfoils of various blades and vanes. Wear and damage may interfere with their aerodynamic efficiency, produce dynamic force imbalances, and even structurally compromise the worn/damaged parts in more extreme cases. A limited reconditioning is commonly practiced for slightly worn or damaged airfoils wherein additional material is removed below the wear/damage to provide the airfoil with a relatively efficient and clean sectional profile albeit smaller than the original or prior profile. Exemplary inspection criteria establishing the limits to which such reconditioning can be made are shown in Pratt & Whitney JT8D Engine Manual (P/N 773128), ATA 72-33-21, Inspection-01, United Technologies Corp., East Hartford Conn. Such limits may differ among airfoils depending upon the location and particular application. The limits are typically based on structural and performance considerations which limit the amount of material that may be removed.

Various techniques have been proposed for more extensive restoration of worn or damaged parts of gas turbine engines. U.S. Pat. No. 4,822,248 discloses use of a plasma torch to deposit nickel- or cobalt-based superalloy material. U.S. Pat. No. 5,732,467 identifies the use of high velocity oxy-fuel (HVOF) and low pressure plasma spray (LPPS) techniques for repairing cracks in such turbine elements. U.S. Pat. No. 5,783,318 also identifies LPPS techniques in addition to laser welding and plasma transferred arc welding. U.S. Pat. No. 6,049,978 identifies further use of HVOF techniques. Such techniques have offered a limited ability to build up replacement material to restore an original or near original cross-section. However, the structural properties of the replacement material may be substantially limited relative to those of the base material.

Especially for larger damage, it is known to use preformed inserts which may be welded in place to repair damage. With such inserts, the damaged area is cut away to the predetermined shape of the insert which is, in turn, welded in place. Structural limits associated with the welding limit the capability of such repair techniques to relatively low stress regions of the airfoil as with other techniques. It is common for engine repair manuals to specify the low stress areas where weld repair is permissible. Thus substantial combinations of the extent of the wear/damage and the stress to which the worn/damaged area is subject may limit use of such techniques. High stress areas often include areas near (e.g., slightly inboard of) a midspan shroud of a fan blade.

SUMMARY OF THE INVENTION

One aspect of the invention involves a method for restoring a machine part which has lost first material from a site (e.g., from a Ti-alloy turbomachine part during operation of the turbomachine). The part is placed in a deposition chamber. A first electric potential is applied to the part. Components for forming a repair material are ionized. The first electric potential is modulated so as to draw the ionized components to the part so that a buildup of the repair material at least partially replaces the first material.

In various implementations, the modulation of the first electrical potential may be performed so as to prevent arcing from the part. The part may be heated and the heating may be modulated in conjunction with the modulation of the first electric potential. The modulation of the first electrical potential may involve maintaining a principally negative potential and applying positive pulses of relatively short duration. The ionizing may be modulated. Additional material may be removed at least partially from the site to create a base surface. The repair material may be deposited atop the base surface at least partially in place of the first material and the additional material. The repair material may comprise or consist essentially of Ti-6Al-4V, Ti-6Al-2Sn-4Zr-2Mo, Ti-8Al-1V-1Mo, or Ti-6Al-2Sn-4Zr-6Mo. The additional material may be removed, in major part, from undamaged portions of the part. The part may be a blade having a root and an airfoil and the site may be along a leading edge of the airfoil inboard of a midspan shroud of the airfoil. The first material may be lost to a depth of 2.0 mm or more. A backing element may be applied to the part protruding adjacent the site so that the deposited repair material builds up on the base surface and backing element. The backing element may be at least partially removed and adjacent deposited material and preexisting material machined to create a second base surface. More of the repair material may be deposited atop the second base surface. The method may be performed at a pressure of less than 0.01 Pa.

Another aspect of the invention involves a method for restoring a Ti alloy turbine part which has lost first material from a site. The part is placed in a deposition chamber. A first electric potential is applied to the part. Components for forming a Ti-based repair material are ionized. The first electric potential is modulated so as to draw the ionized components to the part while maintaining a temperature of the part within a target range so that buildup of the repair material at least partially replaces the first material with desired properties.

In various implementations, the first electric potential may have a nominal voltage of 50V-10 kV, more narrowly, 1-3 kV. A pulse repetition frequency may be 0.05-150 kHz, more narrowly, 0.5-5 kHz. A duty cycle may be 0.01-0.99, more narrowly, 0.1-0.95. An ion current density may be 1-50 mA/cm$^2$ at a deposition rate of 10-50 μm/minute, more narrowly, 2-10 mA/cm$^2$ at a deposition rate of 15-20 μm/minute. The ionizing may be pulse modulated with a pulse repetition frequency of 100-100 Hz and a duty cycle of 0.5-0.9. Modulation of external heating of the part may be performed in conjunction with modulation of the first electric potential.

Another aspect of the invention involves an apparatus for depositing material on a workpiece. The apparatus includes a deposition chamber and a deposition material source. Means are provided for forming a plasma from said deposition material source. Means are provided for applying a modulated bias electric potential to the workpiece to draw ions from the plasma to the workpiece. Means are provided for monitoring a density of the plasma and an ion current to the workpiece. A control system is coupled to the means for forming, means for applying, and means for monitoring and is programmed so as to provide feedback loop control of deposition of the material.

In various implementations, the apparatus may further include means for externally heating the workpiece.

Another aspect of the invention involves an apparatus for depositing material on a workpiece. The apparatus includes a deposition chamber and deposition material at least partially within the deposition chamber. A first electron beam source is positioned to direct a first electron beam to vaporize a portion of the deposition material. The ionizing electrode and an electromagnetic coil surround a flowpath from the deposition material. A bias voltage source is connected to apply an electric potential to the workpiece. A control apparatus is coupled to the bias voltage source and configured to apply said electric potential as a principally negative potential interspersed with positive pulses.

In various implementations, the control apparatus may be coupled to the ionizing electrode for pulse modulation of ionization. A second electron beam source may be positioned to direct a second electron beam to the workpiece.

Another aspect of the invention involves a repaired metallic part having a substrate. A repair material has a first interface with the substrate. A bond strength between the repair material and the substrate is in excess of 50 ksi.

In various implementations, the repair material may be a first repair material. A second repair material may have a second interface with the substrate and a third interface with the first repair material. Second and third bond strengths between the second repair material and the substrate and first repair material, respectively, may be in excess of 50 ksi and may be between 100 ksi and 200 ksi. The substrate and repair material may comprise Ti-alloys or nickel- or cobalt-based superalloys of like nominal composition (of essentially the same composition so as to have essentially similar properties or further of identical compositions at a given concentration resolution (e.g., 2%, 1%, 0.5%, or 0.1%, by weight of the minor constituents or of all constituents.)). The repair material may have a depth of at least 2.0 mm. The substrate may have a local thickness in excess of the depth of the repair material. The substrate may comprise original unrepaired material or previously-repaired material.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
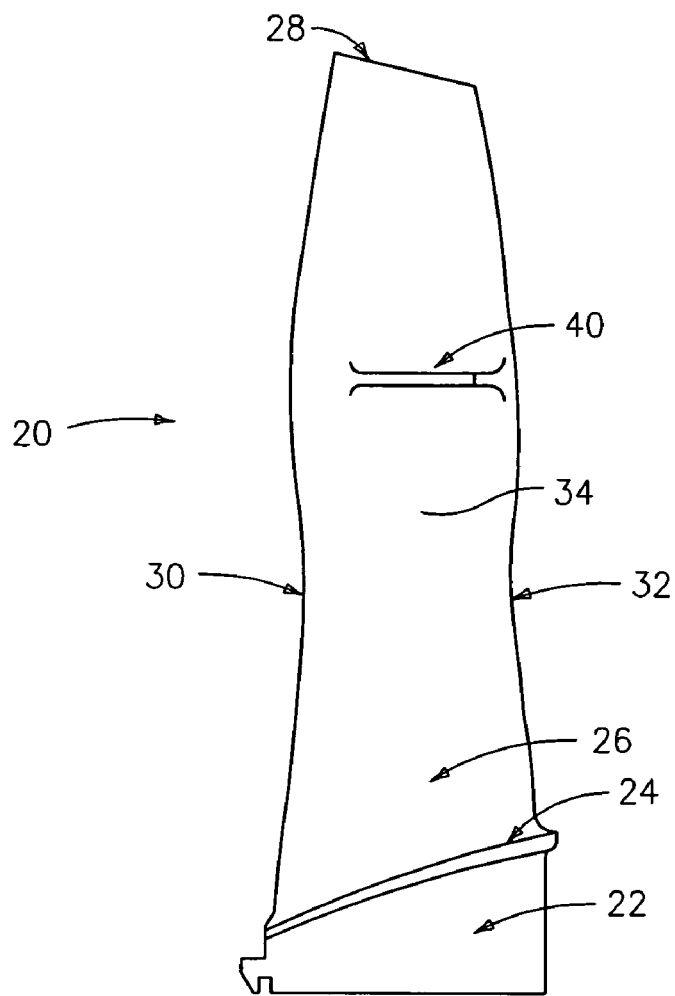
FIG. 1 is a view of an airfoil of a fan of a gas turbine engine.
Figure 2:
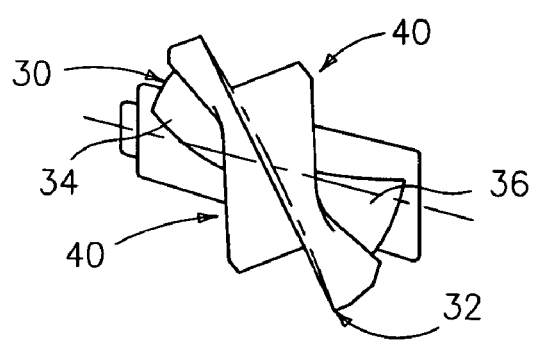
FIG. 2 is a tip-inward view of the airfoil of FIG. 1.

FIG. 1 shows a fan blade 20 from a gas turbine engine. The blade has an inboard blade root 22 configured for attaching the blade to a disk (not shown). A platform 24 separates the blade root from an airfoil 26 extending from the platform to a tip 28. The airfoil has a leading edge 30 and a trailing edge 32 with suction and pressure sides 34 and 36 extending therebetween. In the exemplary blade, in an intermediate location along the span between the platform and tip, a midspan damper shroud projection 40 extends from each of the pressure and suction side surfaces.

The pressure and suction side projections 40 may respectively interact with the suction and pressure side projections of the adjacent blades to damp blade oscillation. The rotating mass of the midspan shroud projections along with forces from their interaction with adjacent projections subjects the blade to high stresses in areas proximate and inboard of these projections. These stresses may limit repairability of these areas relative to other less-stressed areas. It has been discovered that electron beam physical vapor deposition (EBPVD) may be used to deposit repair material with low residual stress and with structural properties substantially the same as the underlying base material. The deposited material may have enhanced strength and enhanced adhesion to the base material relative to welding repair techniques. The deposition advantageously occurs in the absence of a transient liquid phase, with solidification directly from the vapor cloud.

Figure 3:
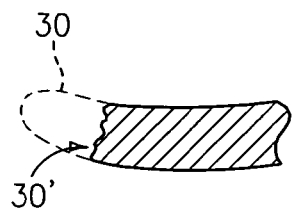
FIG. 3 is a partial sectional view of the airfoil of FIG. 1 upon damage.
Figure 4:
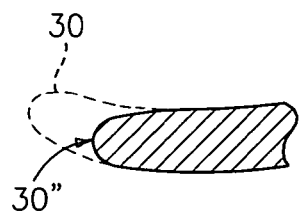
FIG. 4 is a partial sectional view of the airfoil of FIG. 1 upon wear.
Figure 5:
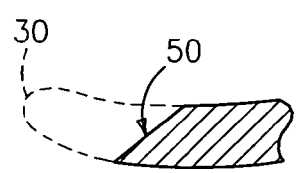
FIG. 5 is a partial sectional view of the airfoil of FIG. 1 after machining to remove damaged/worn surfaces.

FIG. 3 shows localized damage such as is associated with foreign object damage (FOD) nicking or chipping the airfoil proximate the leading edge to create a damaged leading portion 30'. FIG. 4 shows more general damage such as a leading edge eroded to a location 30". The damage site is advantageously cleaned of contamination Further removal of base material may provide an advantageous base surface for receiving deposition. In the exemplary restoration procedure, after the damage/wear, the remaining base material of the blade is ground to a preset configuration such as providing an angled leading facet or base surface 50 (FIG. 5). The facet is shown at an included angle $\theta_1$ to the concave pressure side surface 36. Exemplary $\theta_1$ are over 120°, more narrowly, 120°-130°. The position/orientation of the facet 50 may depend on a number of factors and may be fixed based upon the location of the damage so that, in a given repair facility, any damage at a given point on the airfoil will result in similar machining.

Figure 6:
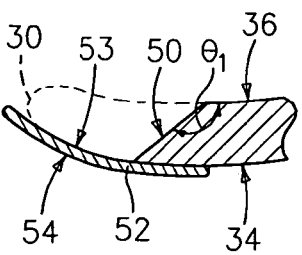
FIG. 6 is a partial sectional view of the airfoil of FIG. 5 after the application of a backing element.

In an optional illustrated variation, a backing scaffold/mask element 52 (FIG. 6) is secured to the airfoil projecting beyond the facet 50 adjacent to the location of the lost/removed material. In the exemplary embodiment, the backing element 52 may be a metallic (e.g., aluminum) tape having first and second surfaces 53 and 54, a trailing portion of the first surface 53 being secured to a remaining intact leading portion of the suction side surface 34. A forward portion of the surface 53 protrudes beyond the lost leading edge 30 and an intermediate portion extends aligned with a lost portion of the surface 34 along the original contour of the airfoil. In optional variations, the surface 53 may extend fully or partially to either side of alignment with the lost original surface contour.

Figure 7:
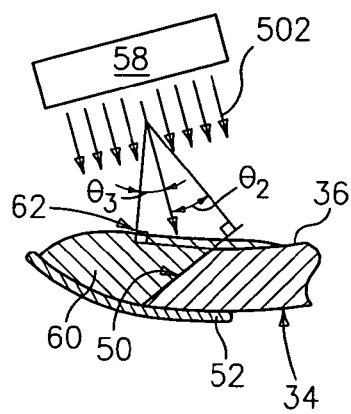
FIG. 7 is a partial sectional view of the airfoil of FIG. 6 after deposition of initial material to rebuild the airfoil.

The blade may then be positioned relative to a vapor source 58 (FIG. 7) emitting vapors along line of sight paths 502. Advantageously the source/paths are oriented so that the paths are within slight angles $\theta_2$ and $\theta_3$ off perpendicular to the surfaces 50 and 36. Exemplary $\theta_2$ and $\theta_3$ are less than 30°. Deposition from the source 58 gradually builds up a first repair material 60. This is advantageously built up to a surface contour 62 beyond the pressure side portion of the lost original contour of the airfoil. Curvature of the surface 36 produces associated change in $\theta_3$ along the deposition-receiving portion of such surface adjacent the base surface 50.

Figure 8:
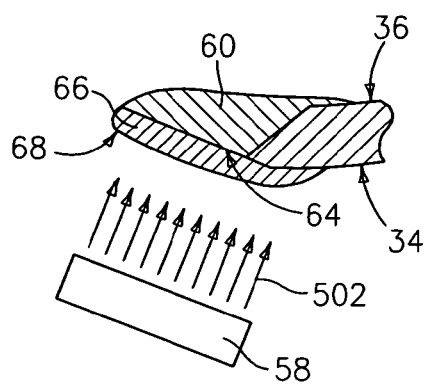
FIG. 8 is a partial sectional view of the airfoil of FIG. 7 after further machining and deposition of additional material to rebuild the airfoil
Figure 9:
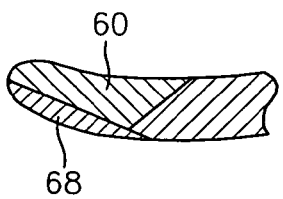
FIG. 9 is a view of the airfoil of FIG. 8 after further machining.

After this deposition stage, the blade may be further machined to remove the backing element 52 and create a second facet or base surface 64 (FIG. 8) extending along the deposited material 60 and the original base material. In the exemplary embodiment, this machining process further removes a previously intact leading portion of the suction side surface 34. The blade may be reoriented relative to the source 58 so that the surfaces 64 and 34 are just slightly off perpendicular to the paths 502 and a second additional material 66 deposited thereatop to reach a contour 68 beyond the suction side portion of the lost original contour. The deposited materials 60 and 66 may then be machined down to a specified final contour advantageously identical to the lost original contour (FIG. 9). Thereafter, additional surface treatments and/or protective coatings may be applied.

The restoration material is deposited by an EBPVD or an ion-enhanced EBPVD process. The EBPVD process is believed to provide advantageous physical properties via deposition in the absence of a transient liquid phase. EBPVD is believed to have lower residual stress and better adhesion than other processes such as plasma spray deposition. The ion-enhanced EBPVD process is believed to ensure better adhesion and higher quality deposition (namely, a more homogeneous and dense deposited material) at relatively lower temperature than conventional EBPVD. The exemplary deposition is performed in a vacuum chamber at a pressure between $10^{-1}$ and $10^{-4}$ Pa, more narrowly, approximately $(5-10) \times 10^{-3}$ Pa. The exemplary deposition rates are between 10 and 100 micrometers per minute, more narrowly, between 10 and 50 micrometers per minute, with an exemplary approximately 20 micrometers per minute. The localized deposition may build up to essentially any depth in one or more stages, the separate stages being characterized by some combination of intervening machining or repositioning of the component relative to the vapor source. Individual stages may well deposit material to depths over 2 mm, over 5 mm, or even more. For particularly expensive components, the process could be utilized to completely replace lost features. For example, if a blade is broken off of a unitary disk and blade ring, a replacement blade may be built up from the disk. By way of example, adhesion strengths may be in excess of 50 ksi, more advantageously in excess of 100 ksi. One implementation of the exemplary ion-enhanced EBPVD process has produced an adhesion strength measured at 149 ksi. By way of contrast, a non-ion-enhanced process and an air plasma process respectively yielded 22 ksi and 7 ksi.

The same procedure may be used to restore material to the trailing edge of the airfoil or to the leading or trailing edges of the midspan shroud or to tip regions, even where lost material has exceeded traditional repair limits. Similar deposition could affect repairs on the suction or pressure side surfaces more remote from the edges. For such repairs, single deposition stages would typically be sufficient. On a convex surface (e.g., of the suction side), a relatively flat facet machining could be particularly convenient. On a concave surface (e.g., of the pressure side) a concave machining (e.g., with a doubly convex grinding quill) may be appropriate. Advantageously, with such concave machining the machined surface remains within the desired angle of normal to the vapor paths along its entire area.

Machining other than the flat-facet grinding may be utilized. The most important element of effective machining is providing a clean base surface for subsequent deposition. Although advantageously smooth, a desired or acceptable level of roughness may be provided. Advantageously, the blade remains stationary during each deposition stage so as to limit the presence of columnar discontinuities in the deposited material.

Figure 10:
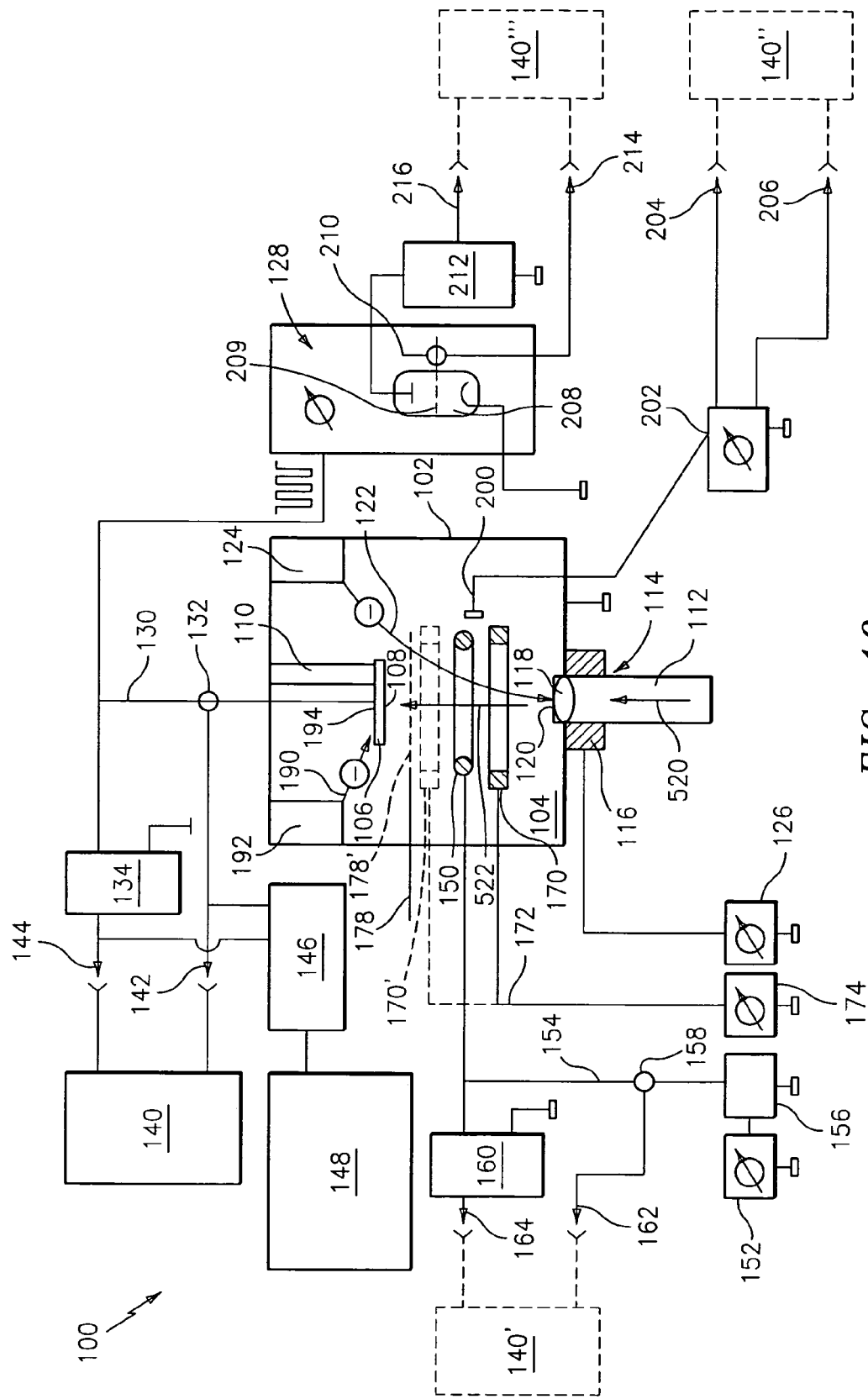
FIG. 10 is a schematic view of an ion-enhanced physical vapor deposition apparatus for depositing the initial and additional material of FIGS. 7 and 8.

FIG. 10 shows an ion-enhanced EBPVD apparatus 100 for performing the foregoing deposition. The apparatus includes a vacuum chamber 102 having an interior 104. A workpiece 106 (e.g., a turbine engine part) having a surface portion 108 for receiving deposition is positioned in the chamber interior and held by a fixture 110. The chamber may have various additional features (not shown) such as an integral vacuum pump for pumping down the chamber, a load lock chamber for introducing and removing the workpiece 106, and various sensors.

The deposition material may, at least in part, come from an ingot 112 which may be progressively and continuously inserted into the chamber along an insertion direction 520 through a chamber port 114. Exemplary ingot material is carefully chosen to achieve a desired chemistry for the resulting deposited material. For example, it may be desirable that the deposited material has the same chemistry as the basic substrate material of the workpiece being repaired. Where the latter is a pure elemental material, the former may be likewise. With alloys, however, there may need to be chemistry variations for several reasons. The reasons may vary depending upon the chemistry of the alloy, the structure of the deposition apparatus, and the operational parameters of the deposition apparatus. For example, the lightest vaporized alloy elements (e.g., aluminum in a titanium-aluminum-vanadium alloy and vapor mixture) may be forced toward the periphery of the vapor stream by the heavier elements (e.g., the titanium). To the extent that the workpiece is aligned with the center of the stream, the deposited material will tentatively reduce concentrations of lighter elements relative to their original concentration in the ingot. Accordingly, to achieve a desired deposition material composition, the ingot may have a higher concentration of lighter elements. Thus, to deposit an exemplary Ti-6Al-4V material, a Ti-8Al-4V ingot may be utilized.

For deposition of material including refractory elements (e.g., deposition of Ti-8Al-1V-1Mo) the refractory elements may be depleted in the vapor stream if the operating temperature is chosen for even evaporation of the lighter components and is too low for substantial evaporation of the refractory components. This situation may binder deposition of alloys having refractory components by conventional EBPVD techniques.

With ion-enhanced EBPVD, the deposition surface of the workpiece is bombarded with ions of the deposition material. The bombardment applies additional energy to the surface. This additional energy heats the surface, enhancing surface activity and causing surface atom displacement and diffusion, atom mixing, subimplantation and implantation into earlier-deposited material. The roles of various atomic processes depend upon the ion energy and the nature of the bombarding ions and the deposition surface. The ion enhancement may result in enhanced atomic binding, stronger adhesion of the deposited material, and higher density deposited material. The ion bombardment of the deposition surface in the ion-enhanced PVD process produces kinetic sputtering of surface atoms, removing those atoms from the deposition material. Early in the deposition process, this sputtering has a particular effect of cleaning the deposition surface of impurities. Later in the deposition process, the sputtering tends to remove the weakly adhered atoms, thus resulting in a higher quality (e.g., adhesion and density) deposition. In many situations, the sputtering of each alloy component will be similar (due to closeness in atomic weight and the sputtering coefficients of the components and due to binding between atoms of the components). Otherwise, the deposited alloy may be depleted of those components for which sputtering preferentially occurs. However, moderate ionization of the vapor and the moderate ion bombardment of the deposition surface should not adversely affect the chemical composition of the deposited material. With only moderate ionization, the ion flux on the deposition surface (and thus the flux of sputtered atoms) will be small relative to the depositing atom flux on the deposition surface. For example, in the deposition of Ti-6Al-4V, an ion current density of 1-50 mA/cm$^2$ at a deposition rate of 10-50 μm per minute and an ion energy of up to 10 keV may be acceptable. In the deposition of alloys having light components (e.g., the Al in Ti-6Al-4V) the lightest atoms may be preferentially sputtered. However these atoms will be somewhat redeposited due to backscattering caused by collisions with heavier atoms (e.g., the Ti) in the dense vapor stream.

Appropriate seals may be provided to prevent leakage around the ingot. Alternatively, the ingot and its progressive movement actuator (not shown) may be located within the chamber 104. An inboard end of the ingot becomes positioned within a crucible 116 along a bottom one of the walls defining the chamber. A molten pool 118 of metal from the ingot is formed within the chamber and has a surface or meniscus 120. The ingot is melted to provide the pool via an electron beam 122 emitted from an electron gun 124 which may be positioned within or without the chamber to direct the beam to the inboard ingot end/pool. The crucible serves to contain the pool. The crucible is advantageously cooled to keep it from melting (e.g., by passing a cooling fluid such as water through an external cooling jacket (not shown)). In the exemplary embodiment, the crucible is an electromagnetic crucible unit having a cylindrical winding around the ingot powered by a power supply 126. The energized winding generates a magnetic field within and above the molten pool 118. Exemplary magnetic field inductions are 0.003-0.06 T. The magnetic field serves to help focus the electron beam 122, which may have been defocused by the ionizing discharge plasma and the magnetic field of the discharge current, so as to enhance the evaporation rate. The magnetic field also helps stabilize the ionizing discharge on the surface 120 by preventing the movement of discharge cathode spots to a crucible periphery and, thereby, avoiding vacuum arc burning on the crucible body. The magnetic field helps control the discharge plasma parameters by affecting the ionization degree and spatial distribution. The magnetic field also influences rotational flow of metal in the pool 118. This flow helps enhance mixing of the components of the molten metal and decreases metal spitting. The rotation of liquid metal is a result of the interaction of electrical current in the metal, caused by the electron beam and ionizing discharge, with the magnetic field of the winding. The rotation also enhances evaporation efficiency due to decreased heat transfer to the cooled crucible wall.

The heating by the electron beam is effective to vaporize the metal in the pool. To draw positively charged metal ions to surface 108, the workpiece 106 is subjected to a negative bias. A pulse modulator 128 is coupled to the workpiece 106 via a line/conductor 130. The bias voltage may have a square pulse wave form characterized by a pulse repetition frequency $F_b$ (pulse rate), a pulse width $\tau_b$, duty cycle $D_b$, and a peak voltage $U_b$. $D_b = \tau_b \times F_b$. Alternate bias voltage wave forms may be used (e.g., sinusoidal). However, the square pulse wave form is believed to provide particularly efficient energy input to the deposited material. With a non-modulated direct current bias, arc discharge (arcing) would likely occur on the surface 108, especially in the first few seconds of deposition. Such discharge may damage the surface. Pulse modulation of the bias voltage may effectively suppress such arcing. Decreasing of pulse width decreases the probability of arcing as arc formation needs sufficient time (e.g., from one hundred to several thousands of microseconds). Even if an arc discharge occurs, the break (pause) between bias pulses would quickly interrupt the discharge.

Advantageous bias voltage parameters may vary greatly based upon the nature of the apparatus, the nature of the deposition material, the size of the workpiece (mass and linear dimensions), and the like. The exemplary peak voltage is a negative voltage in the range of 50-10,000 V. The exemplary pulse repetition frequency is in the range of 0.05-150 kHz. The exemplary pulse width is ≧about 5 μsec. Such pulse width is advantageous because only a few of the ions would reach the workpiece with full energy if there were shorter pulses of like voltage. Ions generated from vapor species of metal atoms need a relatively long time (roughly proportional to their mass) to pass across the space charge shell around the workpiece to reach the workpiece from the vapor plasma. The shell separates the vapor plasma from the workpiece with negative potential. The metal ions are accelerated by the bias voltage. The time needed for the ions to cross the shell (e.g., about 1 μs) would practically need to be shorter than the pulse width $\tau_b$. The bias voltage parameters may be changed dynamically during the deposition process to control parameters of deposition, especially the temperature of the workpiece. It is advantageous that the process begin with relatively high $U_b$ and $D_b$ with the value then decreasing to keep the workpiece temperature within a target range. The values may be increased if the temperature reaches or falls below the low end of such range. In an exemplary implementation, only the duty cycle is varied during operation. For example, during initial interval of an exemplary 0.5-2.0 minutes the duty cycle may be approximately 0.9. The duty cycle is then decreased to a value of approximately 0.1-0.4 for several minutes to avoid overheating. The duty cycle may incrementally be increased back toward the 0.9 value as appropriate to maintain the operating temperature within the target range.

As noted above, one potential problem which may be addressed is the arcing on the deposition surface (the surface portion 108 or the surface of deposition material deposited thereatop). This may result from the ions of deposited material taking the surface to a breakdown potential. The arcing may be a short unipolar discharge (sparking) due to the electric charge of ions stored on the deposition surface. A second electrode is not needed for this form of arcing. In some cases, however, the sparking initiates a hard bipolar arc between the workpiece (acting as a cathode) and the plasma or grounded elements (acting as an anode). The hard arc can damage both the deposition surface and the bias voltage source (short circuited by the arc). A decrease in bias voltage pulse width decreases the probability of hard arcing as the sparking and arc formation needs sufficient time (e.g., from 100 μs to several ms depending upon several factors) for storing the breakdown electric charge on the deposition surface. Notwithstanding the pulsing, the breakdown surface potential may be achieved over several pulses and associated charge storage. This problem may be reduced or eliminated by temporarily reversing the bias voltage such as by applying short positive pulses (e.g., 1-10 μs) of small magnitude (e.g., 50-200V) to the workpiece. The positive pulse attracts electrons from the discharge plasma to the surface to at least partially cancel the ion surface charge. Such polarity reversal may especially be useful with relatively nonconductive (e.g., nonconductive or semiconductive) deposition material (e.g., ceramic-like material) wherein the material acts as a film capacitor capable of storing ion charge. With more conductive materials (e.g., metals and alloys and other metallic materials), the brief pause between negative pulses may alone be sufficient to suppress arcing.

A current sensor 132 may be coupled to the conductor 130 for measuring parameters of the current therethrough (e.g., a current associated with the ion bombardment of the surface portion 108 or material thereatop). In the exemplary embodiment, a voltage divider 134 is coupled to the conductor 130 (e.g., upstream of the sensor 132) for measuring the bias voltage and observing its wave form. An oscilloscope 140 may be connected across outputs 142 and 144 of the sensor 132 and divider 134, respectively, for monitoring the bias current and voltage. A digitizer 146 may similarly be connected to such outputs and, in turn, connected to a digital monitoring and/or control system 148.

To maintain an ionizing discharge along a vapor/ion flowpath 522 from the pool 118 to the surface 108, an ionizing anode electrode 150 (e.g., a ring at least partially surrounding the path 522) is connected to a power supply 152 via a line/conductor 154. The discharge provides the necessary degree of ionization of evaporated species. The degree of ionization may be characterized by an ion current density $j_i$ on the deposition surface. Exemplary $j_i$ are 1-50 mA/cm², more narrowly, approximately 2-10 mA/cm². This may be associated with an exemplary discharge current of 50-200A. For deposition of titanium alloys, an exemplary associated discharge voltage is 8-20V. A pulse modulator 156 may be provided between the power supply 152 and ring 150 to modulate the ionizing discharge. The ionizing discharge may have a frequency $F_a$, a pulse width $\tau_a$, a duty cycle $D_a = \tau_a \times F_a$, and a peak current $I_a$.

Modulation of the ionizing discharge may have several effects. Decreasing the duty cycle shortens discharge on-time which is associated with the period during which the discharge affects (e.g., defocuses) the electron beam 122. Such defocusing may decrease the evaporation rate. The modulation may stabilize the ionizing discharge by preventing jumping of a discharge from the surface of the pool to the crucible body periphery to prevent vacuum arc burning on the crucible body. Such burning is quite disadvantageous as the crucible material may provide undesirable impurities in the deposited materials. The main mechanism of vacuum arc excitation on the conductive surface of the crucible body is the electrical explosion of sharp microscopic irregularities due to their heating by the field emission current (e.g., for which the plasma of the ionizing discharge serves as an anode). Sufficient heating requires a sufficient interval. The pulsing of the ionizing discharge provides periodic interruption of the heating of and field emission from the crucible microscopic irregularities to permit sufficient cooling to ensure a stable discharge. The modulation parameters are chosen to provide a desired current density on the deposition surface of the workpiece with desired ionizing discharge stability in view of permissible effects upon the electron bean and evaporation rate. Exemplary modulation parameters involve a frequency $F_a$ in the range of 1-10,000 Hz, more narrowly 100-1,000 Hz, and a duty cycle $D_a$ in the vicinity of 0.1-0.95, more narrowly 0.5-0.9. One or more discharge pulse parameters may be varied during deposition process. For example, duty cycle may be gradually decreased during some period after the beginning of the deposition process. A decrease to zero might provide a soft transition from ion-enhanced EBPVD to conventional EBPVD. Various wave forms may be used alternatively to the square pulse. A current sensor 158 may be coupled to the line 154 with a voltage divider 160 connected to the line downstream thereof to provide outputs 162 and 164 which may be connected to the oscilloscope when the oscilloscope is connected as shown by 140'. A digitizer (not shown) may be connected to a digital monitoring and/or control system (not shown) and may be used in lieu of or addition to the oscilloscope 140'. An electromagnetic ring 170 also at least partially encircles the flowpath 522 and is connected via a line/conductor 172 to a power supply 174. In the exemplary embodiment, the electromagnetic ring 170 is positioned upstream of the anode ring 150 along the flowpath 522. However it may alternatively be positioned downstream as shown by 170' or even behind (downstream of) the workpiece 106. An exemplary ring 170 is formed of several turns of a conductor about the flowpath 522 to form a coil. The ring/coil 170 may be energized to provide a magnetic field in the vicinity of 0.003-0.03T in order to enhance vapor ionization by electrons emitted from the cathode and to control the spatial distribution of the discharge plasma due to the influence of the magnetic field on the trajectory of plasma electrons. The plasma electrons flow mainly along magnetic field lines (e.g., spiraling around the field lines). Thus increased field strength produces increased plasma density. Appropriate configuring of the magnetic field produces appropriate plasma distribution. This may involve providing a distributed density of plasma near the workpiece surface and an associated distributed ion current over the surface (e.g., to provide increased ion current along more massive parts of the workpiece to provide more even heating by the ion bombardment). Varying the current in the electromagnetic ring or the position thereof during deposition permits dynamic control of ion distribution over the deposition surface and may be used to achieve a desired heating.

A shutter 178 may have a first position (solid line) clear of the flowpath 522 and a second position (broken line) 178' blocking the flowpath 522. The shutter may be positioned downstream of the anode ring 150 along the flowpath 522. The shutter may be in the second position 178' during preparation as the apparatus is brought up to initial target operating conditions. During this stage, the ingot material is melted to form the pool, the ionizing discharge is established, the negative bias voltage is applied to the workpiece, and the workpiece may be preheated. The workpiece 106 may be preheated via an electron beam 190 delivered by a second electron gun 192 to impact a non deposition surface portion 194 of the workpiece. The preheating may serve to clean the deposition surface by pyrolysis and desorption of surface impurities. This may enhance binding and adhesion of deposited material and avoid thermal shock during the initial stages of deposition. In an exemplary embodiment, the preheating may be varied to provide a gradual increase in workpiece temperature effective to achieve a desired rate of vapor, thermo-desorbed from the workpiece, in view of equipment parameters limiting the evacuation of such vapor while avoiding unacceptable oxidation of the workpiece. Preheating parameters may depend greatly upon the geometry and mass of the workpiece. The preheating should advantageously bring the workpiece to a temperature no greater than the maximum operational target temperature, and advantageously, generally within the operational target temperature range. With the parameters in the initial target range, the shutter is opened to expose the workpiece to deposition. During deposition, the workpiece may be heated by the second electron gun 192, by the ion bombardment, by heat radiation (e.g., from the melted metal in the pool), and by the latent heat of the atoms condensing in the deposition. The second electron gun is turned off if the temperature exceeds the maximum of an operational target range and may be turned off so long as the temperature is within the target range. It may, however, be switched back on if the temperature falls below a minimum of the target range. For example, if the deposition rate is decreased toward the end of a deposition process, the electron gun may need to be turned back on during the decreased rate stage.

In operation, the density of the plasma may be monitored by a plasma probe or probe array 200 within the chamber and connected to a registration system 202 which may have output ports 204 and 206 to permit monitoring (e.g. via an oscilloscope connected as shown by 140"). An exemplary probe may be an electrode under negative potential relative to the plasma in order to measure the saturated ion current. By surrounding the path 522 with a probe array, the azimuth non-uniformity of the ionizing discharge may be monitored. Azimuth non-uniformity may be caused by asymmetric heating of the pool by the electron beam and asymmetrical distribution of the ionizing discharge over the pool and within the vapor stream. The probes may be used for monitoring the spatial distribution of the vapor stream as well. The probes may be used both in ion-enhanced EBPVD and conventional EBPVD to the extent that the evaporating electron beam 122 would provide some ionization of the vapor effective to generate current in the probe circuits. The current may be a proportion of the vapor density and evaporation rate. With pulse modulation of the ionizing discharge, probe current during the pulses is used for discharge monitoring. Probe current between discharge pulses may be used for evaporation monitoring. The monitoring allows quick detection of defects in the process and may provide for its stabilization via a feedback loop. For example, it is possible to stabilize the evaporation rate by control of the electron beam 122 so as to maintain constant probe current between pulses.

In an exemplary embodiment, the pulse modulator 128 includes an electronic tube 208. The electronic tube 208 (e.g., a triode, tetrode, or the like) serves as a fast switch device periodically connecting the primary DC power source of negative polarity to the workpiece 106 and thereby generating the negative bias voltage pulses. The primary DC power source voltage can be regulated to determine the peak value of the bias voltage. The pulse modulator also contains a generator (not shown) of control pulses applied to the control grid 209 of the electronic tube. The control pulse parameters determine the parameters of the bias voltage pulses ($F_b$, $\tau_b$, $U_b$, and the corresponding duty cycle). A current probe 210 and voltage divider 212 may be coupled to the tube 208 and provide outputs 214 and 216 which may be monitored as via the oscilloscope connected as shown by 140'''. Such monitoring may serve to verify normal operation of the pulse modulator. Alternative voltage modulators may be used to generate the bias voltage (e.g., based on thyratrons, thyristors, transistors, and step-up transformers). However, electronic tube modulators may provide an advantageous combination of robustness and control of current delivered to the workpiece to limit sparking and arcing. An aspect of common electronic tube modulators is that the tube anode current is determined mainly by voltages of the control grid (and by the screen grid in tetrodes and pentodes) and weakly by the anode voltage. Therefore, in the case of arcing on the workpiece the tube anode voltage may sharply rise and become equal to the primary anode DC power source voltage while the control grid voltage remains the same. Accordingly, the anode current (that is the workpiece current) will be practically the same as without arcing. So, the anode current may slightly increase and this slightly increased current is the maximum current to the work piece during arcing. Thus, the electron tube acts to automatically limit the load current. Alternative modulation devices may have difficulty limiting current in the load circuit and may therefore need a very fast acting safeguard system for turning off current in the event of arcing on the workpiece surface. Additional voltage sensors (not shown) may be provided to detect the potential of the crucible or other components within the chamber.

Exemplary process parameters may vary based upon the substrate material, deposition material, substrate geometry, and apparatus capacities. For an exemplary deposition of Ti-6Al-4V, an operating temperature may be 600-700° C., more narrowly 620-650° C. Bias voltages $U_b$ may be 1-3 kV, the pulse rate $F_b$ may be 0.05-150 kHz, more narrowly, 0.5-5 kHz (e.g., about 1 kHz). The duty cycle may be 0.5-0.99, more narrowly, 0.8-0.95 (e.g., about 0.9) at the beginning of deposition progressively decreasing into a relatively low value (e.g., less than half the initial value or about 0.1) and then increasing back toward the initial value. Current densities $j_b$ along the deposition surface portion 108 may be 2-10 mA/cm$^2$. Power flux therethrough may be 2-30 W/cm$^2$. Chamber pressures may be less than 0.01 Pa. Deposition rates may be 5-30 µm/min, more narrowly 15-20 µm/min.

One or more embodiments of the present invention have been described. Nevertheless, it will be understood that various modifications may be made without departing from the spirit and scope of the invention. For example, although particularly useful with blades having midspan shrouds, the methods may be applied to other blades and other turbine parts and non-turbine parts. Details of the particular turbine engine part or other piece and the particular wear or damage suffered may influence details of any given restoration. Accordingly, other embodiments are within the scope of the following claims.

What is claimed is:

1. A method for restoring a part which has lost first material from a site, the first material being from a metallic substrate and the method comprising:
   placing the part in a deposition chamber;
   applying a first electric potential to the part;
   evaporating components for forming a repair material;
   ionizing the evaporated components; and
   modulating the first electric potential so as to draw the ionized components to the part so that buildup of the repair material at least partially replaces the first material.

2. The method of claim 1 wherein:
   the part is a Ti alloy turbine part and the repair material is Ti-based.

3. The method of claim 1 wherein:
   the modulating is performed so as to prevent arcing from the part.

4. The method of claim 1 further comprising:
   heating the part; and
   modulating the heating of the part in conjunction with the modulating of the first electric potential.

5. The method of claim 1 wherein the modulating comprises:
   maintaining a principally negative potential; and
   applying positive pulses of relatively short duration.

6. The method of claim 1 wherein:
   the ionizing is modulated.

7. The method of claim 1 wherein:
the method further comprises removing additional material of the metallic substrate at least partially from the site to create a base surface; and
the physically depositing deposits said repair material atop the base surface at least partially in place of the first material and the additional material.

8. The method of claim 7 wherein the removing of additional material is, in major part, from undamaged portions of the part.

9. The method of claim 1 wherein:
said deposited repair material in major part replaces said first material.

10. The method of claim 1 wherein said repair material comprises material selected from the group consisting of Ti-6Al-4V, Ti-6Al-2Sn-4Zr-2Mo, Ti-8Al-1V-1Mo, and Ti-6Al-2Sn-4Zr-6Mo.

11. The method of claim 1 wherein the part is a blade having a root and an airfoil and the site is along a leading edge of the airfoil inboard of a midspan shroud of the airfoil.

12. The method of claim 11 wherein the first material is lost to a depth of at least 2.0 mm.

13. The method of claim 1 further comprising:
applying a backing element to the part protruding adjacent the site so that the deposited repair material builds up on the base surface and backing element.

14. The method of claim 13 further comprising:
at least partially removing the backing element and machining adjacent deposited material and preexisting material of the part to create a second base surface; and
physically depositing more of the repair material atop the second base surface.

15. The method of claim 1 performed at a pressure less than 0.01 Pa.

16. The method of claim 1 wherein the first electric potential has:
a nominal voltage of 50V-10 kV;
a pulse repetition frequency of 0.05-150 kHz;
a pulse width of at least 5 µs;
a duty cycle of 0.1-0.99; and
an ion current density of 1-50 mA/cm$^2$ at a deposition rate of 10-50 µm/minute.

17. The method of claim 16 wherein:
the nominal voltage is 1-3 kV;
the pulse repetition frequency is 0.5-5 kHz; and
the ion current density is 2-10 mA/cm$^2$ at a deposition rate of 15-20 µm/minute.

18. The method of claim 1 wherein:
the ionizing is pulse modulated with a pulse repetition frequency of 100-1000 Hz and a duty cycle of 0.5-0.9.

* * * * *